(12) United States Patent
Huang et al.

(10) Patent No.: US 7,918,984 B2
(45) Date of Patent: Apr. 5, 2011

(54) METHOD OF ELECTRODEPOSITING GERMANIUM COMPOUND MATERIALS ON A SUBSTRATE

(75) Inventors: Qiang Huang, Ossining, NY (US); Andrew J. Kellock, Sunnyvale, CA (US); Xiaoyan Shao, Yorktown Heights, NY (US); Venkatram Venkatasamy, Edina, MN (US)

(73) Assignee: International Business Machines Corporation, Armonk, NY (US)

( * ) Notice: Subject to any disclaimer, the term of this patent is extended or adjusted under 35 U.S.C. 154(b) by 869 days.

(21) Appl. No.: 11/856,335

(22) Filed: Sep. 17, 2007

(65) Prior Publication Data

US 2009/0071836 A1 Mar. 19, 2009

(51) Int. Cl.
*C25D 5/02* (2006.01)
(52) U.S. Cl. .......................... 205/118; 205/123; 205/157
(58) Field of Classification Search .................. 205/118, 205/123, 157
See application file for complete search history.

(56) References Cited

U.S. PATENT DOCUMENTS

| 3,833,486 | A | | 9/1974 | Nobel et al. |
| 5,289,453 | A | | 2/1994 | Ohno et al. |
| 5,320,736 | A | * | 6/1994 | Stickney et al. ............. 205/157 |
| 6,027,630 | A | | 2/2000 | Cohen |
| 6,078,558 | A | | 6/2000 | Bruneau et al. |
| 6,229,783 | B1 | | 5/2001 | Bruneau et al. |
| 7,067,865 | B2 | | 6/2006 | Lung et al. |
| 7,078,273 | B2 | | 7/2006 | Matsuoka et al. |

OTHER PUBLICATIONS

Fink et al. (Electrodeposition and Electrowinning of Germanium, J. Electrochem. Soc., vol. 95, Issue 2, pp. 80-97,1949).*

* cited by examiner

*Primary Examiner* — Luan V Van
(74) *Attorney, Agent, or Firm* — Connolly Bove Lodge & Hutz LLP; Louis Percello

(57) ABSTRACT

A method of electrodepositing germanium compound materials on an exposed region of a substrate structure, which includes forming a plating solution by dissolving at least one germanium salt and at least one salt containing an element other than germanium in water; obtaining a substrate with a clean surface; immersing the substrate in the solution; and electroplating germanium compound materials on the substrate by applying an electrical potential between the substrate and an anode in the plating solution, in which the substrate is included in a semiconductor or phase change device.

18 Claims, 6 Drawing Sheets

METHOD OF ELECTRODEPOSITING GERMANIUM COMPOUND MATERIALS ON A SUBSTRATE

BACKGROUND

1. Technical Field

The disclosure generally relates to a method for depositing germanium compound materials on a substrate. In particular, the disclosure relates to electrodepositing germanium compound materials, which may include germanium-antimony-telluride (GeSbTe) as a phase change material, on an exposed region of a substrate structure. The disclosure further relates to a semiconductor or phase change device having electrodeposited germanium compound materials formed on an exposed surface thereof.

2. Discussion of the Background

Phase change (PC) materials have a wide variety of applications in microelectronic devices, such as optical storage media and solid state phase change memory. PC materials generally refer to the materials that may be switched between two phases, amorphous and crystalline. Contrast between the two phases in optical reflectivity or electrical resistivity may be used as binary digital information in electronic logic devices. Sb based PC materials have been widely used in optical storage and phase change memory. Among them, germanium containing compounds, which may include GeSbTe, exhibits a higher phase transition temperature and improved phase stability and thus is particularly of interest for PC devices.

PC materials are currently formed by vapor deposition processes, such as sputtering and evaporation. Such processes produce a continuous PC film and needs extra processes to pattern into structures. Electrodeposition, which also may be referred to as electroplating or electrochemical deposition, is a selective deposition process and is a preferred process for forming separate metallic structures. In addition, the structures produced by electroplating process are defined by the substrate patterns, from which the structures grow, and therefore may be easily scaled down accordingly. However, the electroplating method for forming germanium compound materials is not available.

There have been some limited suggestions of electrodeposition of germanium onto metals. However, these efforts have been thwarted due to the relatively high reversible potential of Ge and the very low hydrogen overpotential on Ge surfaces. As all the plating current results in proton reduction, no Ge plating will occur once the electrode surface is covered by Ge. Therefore, either an extremely alkaline aqueous solution or an organic solvent is used in Germanium deposition to suppress the proton reduction. (See generally Fink et al., Journal of the Electrochemical Society, vol. 95, p. 80 (1948); U.S. Pat. No. 2,690,422 to Szekely and Endres; and Electrochemical and Solid State Letters, vol. 5, p. C38 (2002)).

However, these methods are not compatible for germanium compound deposition for PC devices. In the non-aqueous solution approaches, where a $GeCl_4$ solution in glycol and ionic liquid is generally used, Sb and Te salts cannot be readily dissolved and co-deposited. The techniques also suffer from the disadvantages of high viscosity and expenses. In the alkaline aqueous solution approach, the extremely high pH causes damages to most of the device structures that are built from dielectrics such as silicon oxides.

A co-pending patent application, U.S. patent application Ser. No. 11/774,105, entitled "Method of Making Phase Change Materials By Electrochemical Atomic Layer Deposition" and incorporated herein by reference in its entirety, generally discloses an atomic layer electrochemical deposition method to form single crystalline phase change materials. In particular, in the method of the application, each element is electrochemically deposited in a layer-by-layer fashion from separate solutions. In addition, an apparatus and a preprogrammed plating scheme are applied repeatedly, producing a single crystalline deposit. In the present patent application, a method is disclosed to electrochemically deposit germanium compound materials from a single aqueous solution containing all the elements.

SUMMARY OF THE INVENTION

Accordingly, the following aspects provide a method for forming germanium containing compound materials by electrodeposition. For instance, the disclosure provides a method and solution to deposit a GeSbTe material on an exposed region of a substrate.

In one aspect, the method of electrodeposition comprises:

forming a plating solution by dissolving at least one germanium salt and at least one salt containing another element in water;

obtaining a conductive or semiconductor substrate with a clean surface;

immersing the substrate in the said solution;

and electroplating germanium compound materials on the said substrate by applying electrical potential between the substrate and an anode in the plating solution.

In another aspect, the disclosure provides a semiconductor or phase change device having electrodeposited germanium compound materials formed on an exposed surface thereof according to the method.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the intent of this disclosure. Accordingly, the description is to be regarded as illustrative in nature and not as restrictive.

BEST AND VARIOUS MODES FOR CARRYING OUT THE INVENTION

A more complete appreciation of the disclosure and many of the attendant advantages will be readily obtained, as the same becomes better understood by reference to the following detailed description when considered in connection with the accompanying drawings.

It should be understood that the term "comprising" and its grammatical variation as used herein is used in the inclusive sense of "having" or "including" and not in the exclusive sense of "consisting only of." The terms "a" and "the" as used herein are understood to encompass the plural as well as the singular.

Figure 1:
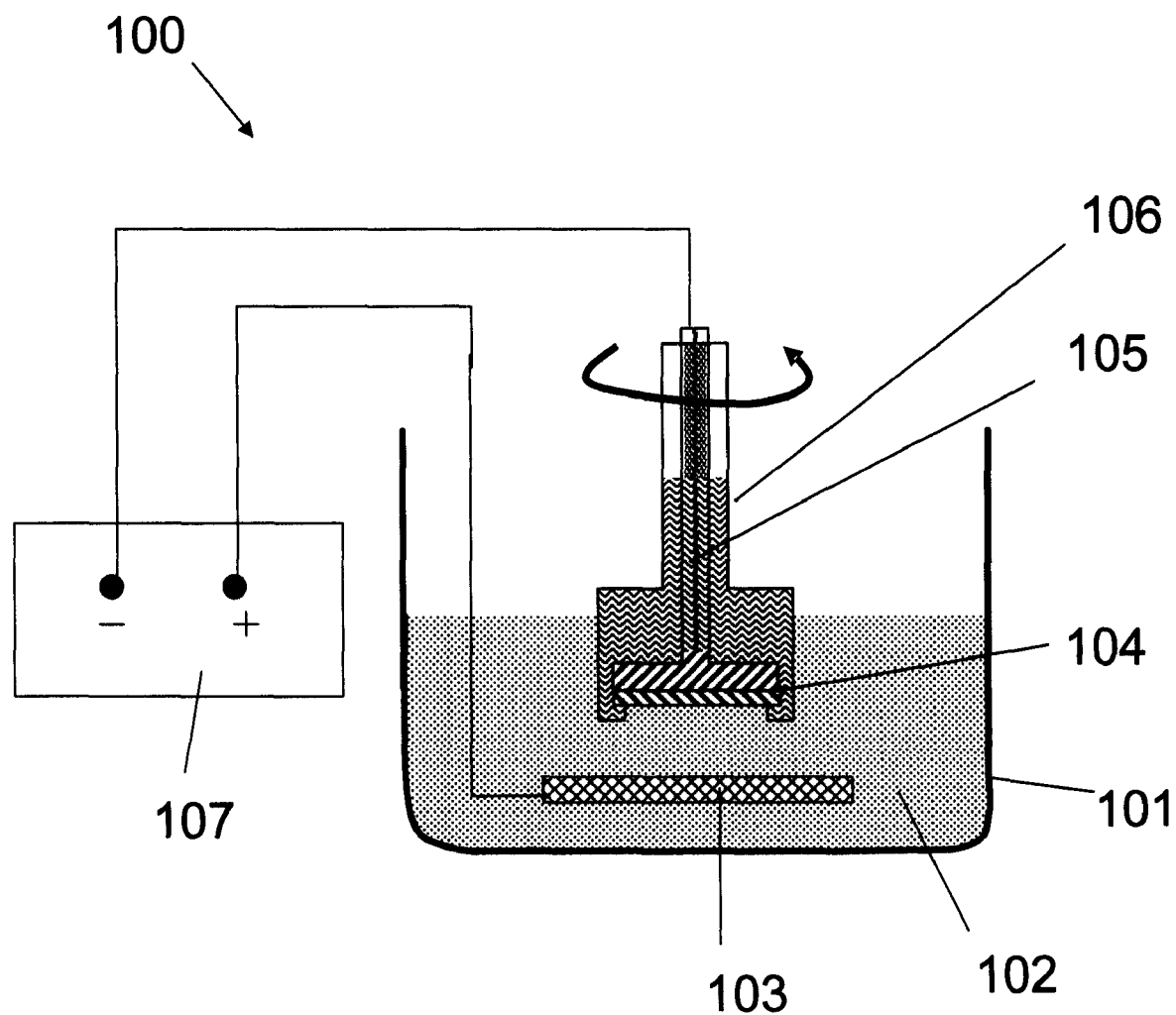
FIG. 1 shows a schematic representation of an exemplary apparatus for electrodepositing germanium compounds on rotating substrates.

The disclosure provides a method for producing germanium containing compound materials by electrodeposition. The electrodeposition process may be carried out in presence or absence of agitation. For instance, FIG. 1 shows a typical apparatus 100 for electrodepositing the germanium compound material on a rotating substrate. The apparatus 100 comprises vessel 101 containing electrolyte 102 and stationary anode 103. Substrate 104 is mounted on rotating cathode 105 and immersed in electrolyte 102. Rotating cathode 105 and edges of substrate 104 are protected from the electrolyte 102 by insulting housing 106. Power supply 107 supplies a current between anode 103 and substrate/cathode 104/105. A typical anode 103 may be platinum. A typical substrate 104 may include Cu, Ni, stainless steel, Au, Pt, Si, and other metals, metal alloys, semiconductors and a combination of above.

Figure 2:
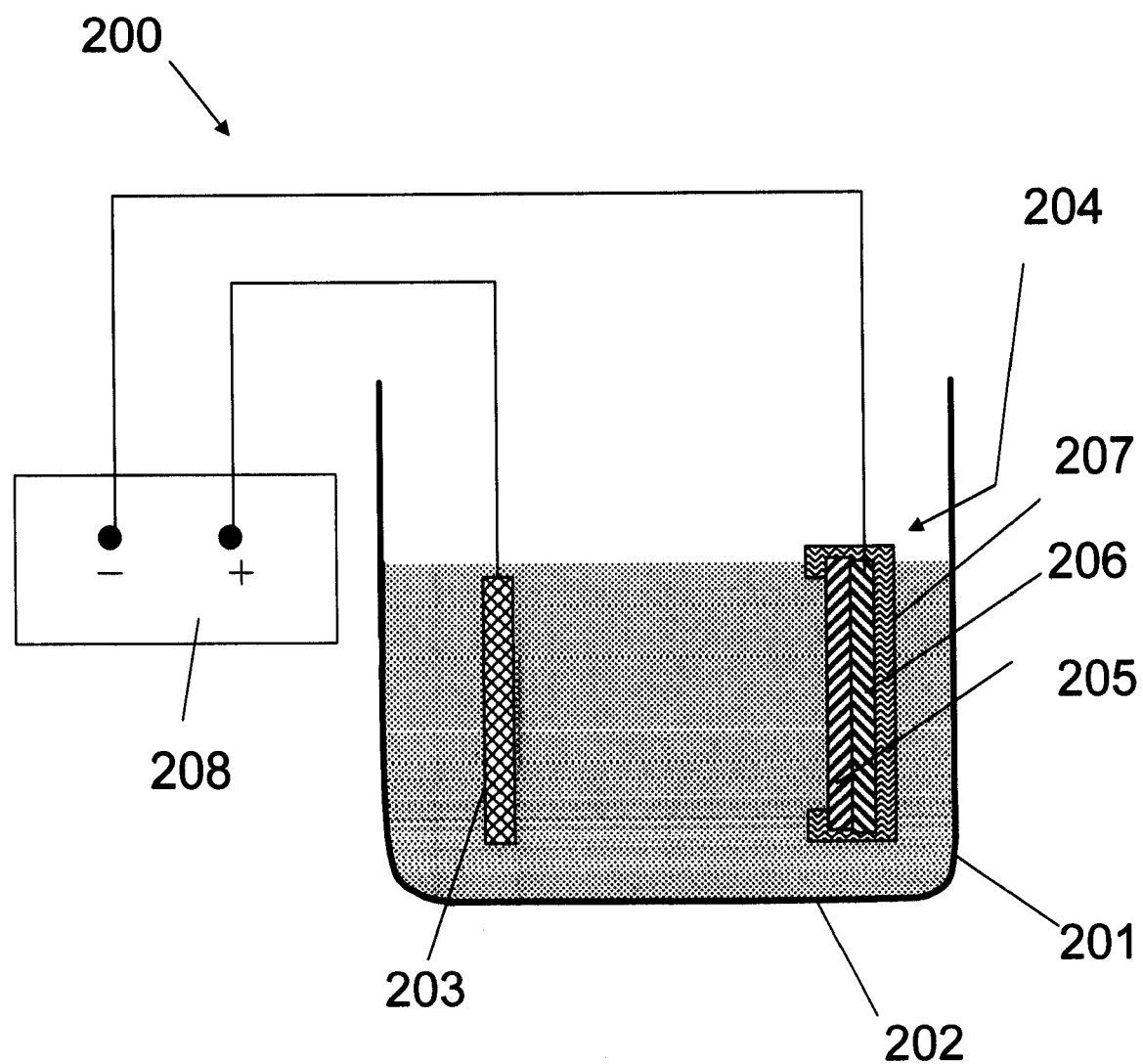
FIG. 2 shows a schematic representation of an exemplary apparatus for electrodepositing germanium compounds on stationary substrates.

FIG. 2 shows an alternative apparatus 200 for electrodepositing the germanium compound material on a stationary substrate. The apparatus 200 comprises vessel 201 containing electrolyte 202, stationary anode 203 and stationary cathode 204. Stationary cathode 204 comprises substrate 205 mounted on a conductive electrode 206. Conductive electrode 206 and edge of substrate 205 are protected from the electrolyte 202 with insulating housing 207. Power supply 208 supplies a current between anode 203 and substrate/cathode 205/206. A typical anode 203 may be platinum. A typical substrate 205 may include Cu, Ni, stainless steel, Au, Pt, Si, and other metals, metal alloys, semiconductors and a combination of above.

Depending on the conductivity of the substrate 205, the conductive electrode 206 is optional. A simplified version of the cathode 204 comprises substrate 205 and insulating housing 207 and a current may be directly applied from power supply 208 to the substrate 205. In a further simplified version of the apparatus, the insulating housing 207 may be a layer of any insulating materials including silicon oxide, photoresist and plastic tape.

The electrolyte used for electrodeposition of germanium compound material is an aqueous solution containing at least one germanium chemical and at least one chemical of other elements.

One particular aspect of the present invention relates to the method and solution for electrodepositing germanium-antimony-telluride (GeSbTe) from an aqueous solution for phase change applications. The electrodeposition of GeSbTe is carried out in an aqueous solution containing at least Ge, Sb and Te.

The electrodeposition may be carried out at temperatures under 80° C. and at room temperature. DC current, pulse current and the combination of both may be used for the electrodeposition. The current density employed is generally about $-0.1$ mA/cm$^2$ to about $-20$ mA/cm$^2$, or about $-1$ mA/cm$^2$ to about $-5$ mA/cm$^2$. The deposition may be carried out on rotating or stationary electrode, and more generally on a rotating electrode. A general rotation rate for the electrode ranges from about 30 to about 4000 rpm, or about 100 to about 1000 rpm.

Prior to immersing the substrate into the plating solution, metal substrate is generally cleaned, such as by washing with a dilute (10%) sulfuric acid solution. A semiconductor substrate is generally cleaned, such as by washing with a dilute (1:100) hydrofluoric acid (HF) solution.

EXAMPLES

The following non-limiting examples are presented to further illustrate the present disclosure.

Example 1

DC Current Plating

The electrolyte in this example and the following example 2 comprises 10 mM GeO$_2$, 1 mM Sb$_2$O$_3$, 0.5 mM TeO$_2$, 1 M H$_2$SO$_4$ and 1 M HNO$_3$, at a pH of 1.5 adjusted with NaOH or NaHCO$_3$. The substrate used in this example and the following example 2 is blanket antimony doped n-Si covered by a layer of 75 nm TiN. The substrate was then mounted on a disk electrode rotating at 550 rpm. A platinum mesh was used as anode and a mercury sulfate electrode (MSE) was used as reference electrode. A constant current of $-3$ mA/cm$^2$ was applied to the substrate for 2 minutes, and a 180 nm thick film was obtained. A composition of 8% Ge, 62% Sb and 30% Te was characterized with Particle Induced X-ray Emission (PIXE, spectrum not shown).

Example 2

Pulsed Current Plating

A pulsed current comprising a $-1$ mA/cm2 pulse for 5 sec and a $-3$ mA/cm2 pulse for 5 sec was applied for 30 cycles. A 208 nm thick film containing 11% Ge, 59% Sb and 30% Te was obtained (PIXE spectrum not shown).

Example 3

Pulsed Potential Plating

A pulsed potential scheme comprising a $-0.8$ V (versus MSE) pulse for 1 sec and a $-1.5$ V (versus MSE) pulse for 1 sec was applied for 300 cycles. A 32 nm thick film containing 12% Ge, 60% Sb and 28% Te was obtained (PIXE spectrum not shown).

Figure 3:
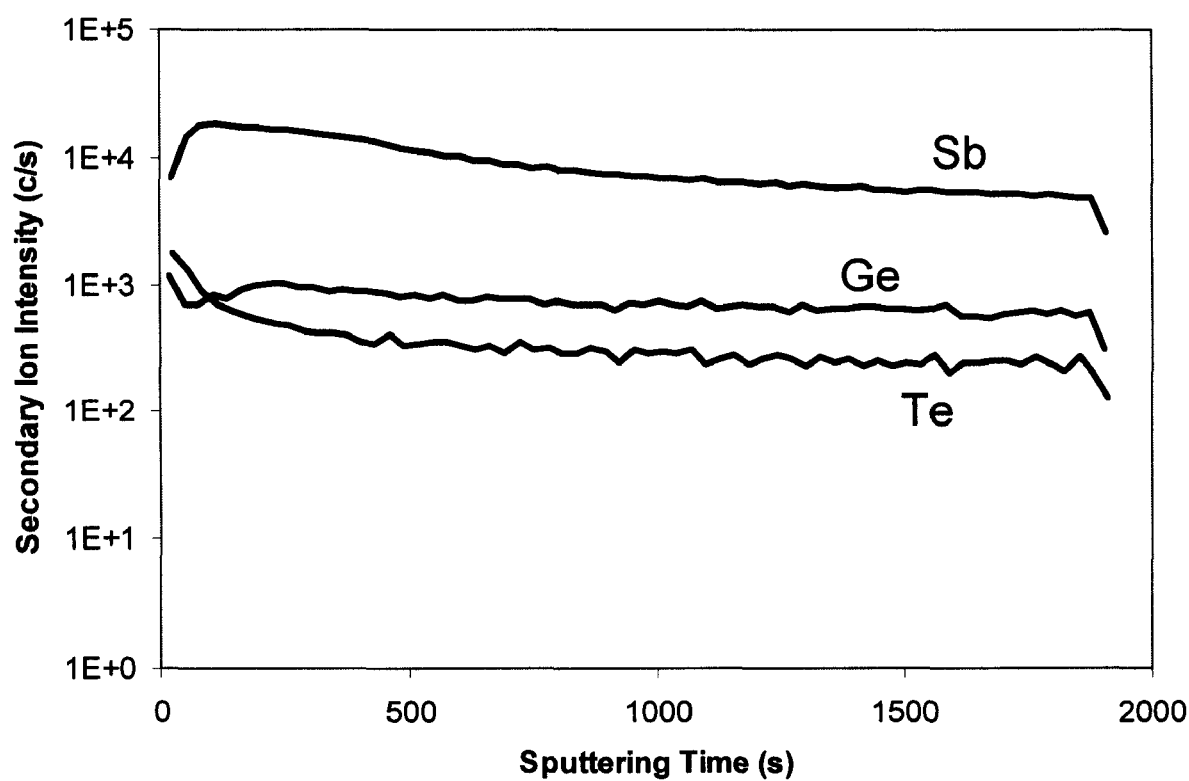
FIG. 3 shows SIMS (secondary ion mass spectrometry) profile of a blanket GeSbTe film plated on TiN substrate with a pulsed potential wave according to an aspect of the disclosure.
Figure 4A:
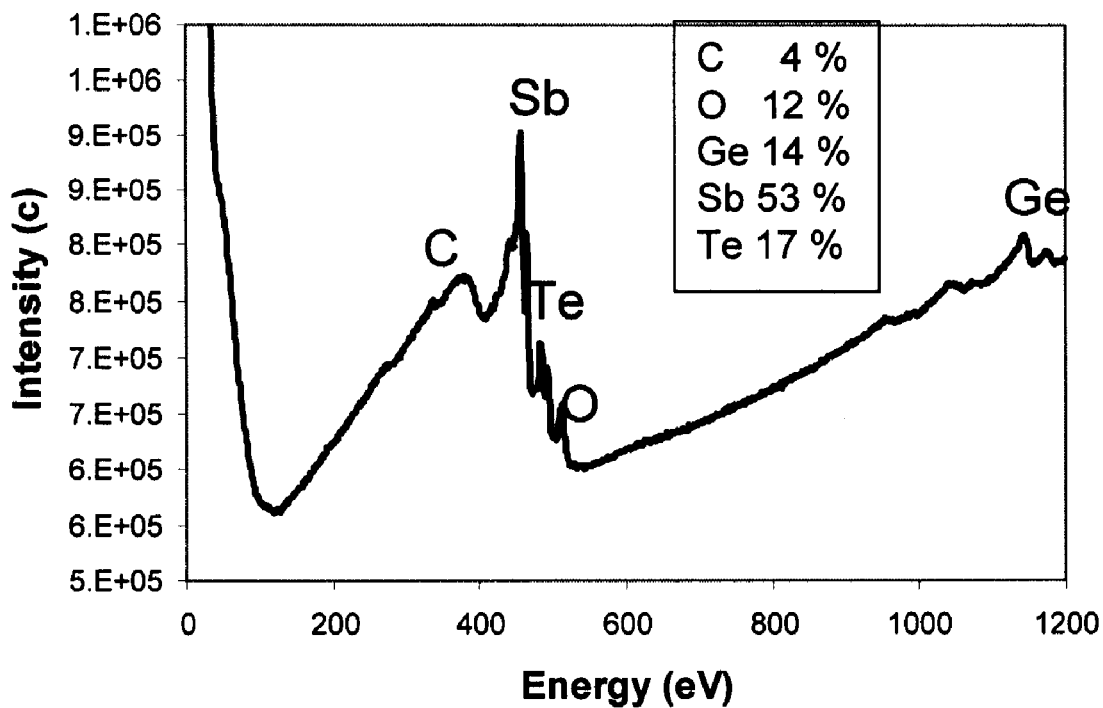
FIGS. 4A and 4B show Auger spectra of two local spots on a blanket GeSbTe film plated on a TiN substrate with a pulsed potential wave according to an aspect of the disclosure.
Figure 4B:
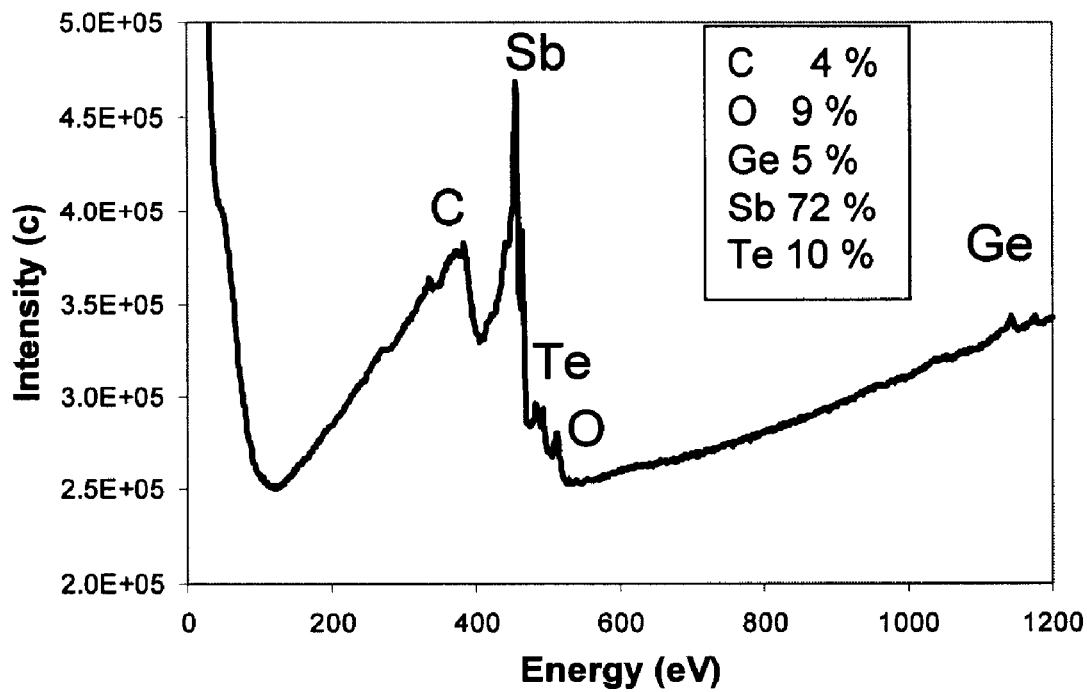

FIG. 3 shows the secondary ion mass spectrometry (SIMS) profile for Ge, Sb and Te elements in the film electrodeposited under the condition in Example 3. It is clear that the three elements are uniformly distributed throughout the same thickness. FIG. 4A and FIG. 4B show the Auger electron spectra for Ge, Sb and Te at two localized spots on the electrodeposited film. Some variation was observed in composition but germanium is present at both locations.

The forgoing examples were used to illustrate some of the various ways to carry out the present invention. Yet, the examples and the germanium compounds therein are by no means limited to the exact examples. The composition of the electrodeposited GeSbTe compounds may be readily varied depending on the electrolyte and the current or potential used in the electrodeposition. Furthermore, the method may be adapted for electrolytes in the absence of one of the elements or with the addition of extra elements. For instance, an electrolyte without TeO$_2$ may be used for electrodepositing GeSb compounds and an electrolyte without GeO$_2$ may be used for electrodepositing SbTe compounds.

In a preferred, but optional, embodiment of the disclosure, the substrate may further comprise patterned stencil with insulating and open areas. In particular, a germanium compound material is deposited selectively on the substrate in the open areas where the substrate is exposed to the electrolyte.

In a further preferred embodiment of the disclosure, the substrate comprises a semiconductor base substrate and patterned insulating regions on or embedded in the semiconductor base substrate.

FIG. 5 shows, in cross section view, examples of selective electrodeposition of the germanium containing compound materials on exposed surfaces of semiconductor substrates comprising patterned insulating regions on or embedded in base material. Substrate structure 500 of FIG. 5A comprises base semiconductor 501 and a patterned stencil 502 on the semiconductor 501. Suitable base semiconductor materials include, but are not limited to, Si, Ge, SiGe alloys, SiC alloys, SiGeC alloys as well as III-V and II-VI semiconductors and any combinations of the above. Patterned stencil 502 comprises insulating regions, where the base substrate 501 is covered, and open regions 503, where the base semiconductor surface 504 is exposed to the electrolyte. Suitable materials for stencil include but not limited to photoresist, e-beam resist, silicon oxide, silicon nitride, silicon oxynitride, aluminum oxide, and other insulating materials.

Figure 5A:
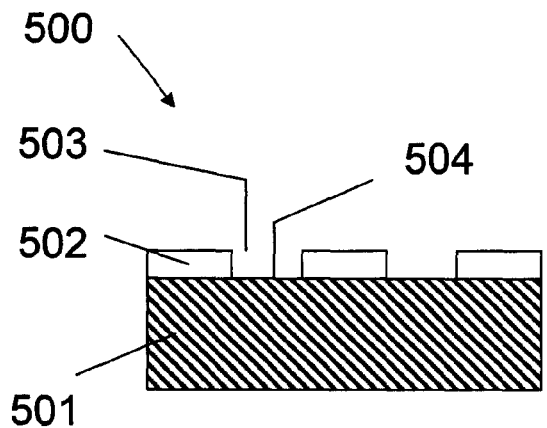
FIGS. 5A to 5J show, in cross section view, the selective deposition of Ge compound materials on exposed surfaces of substrates comprising patterned insulating regions on or embedded in a base conductor or semiconductor material.
Figure 5B:
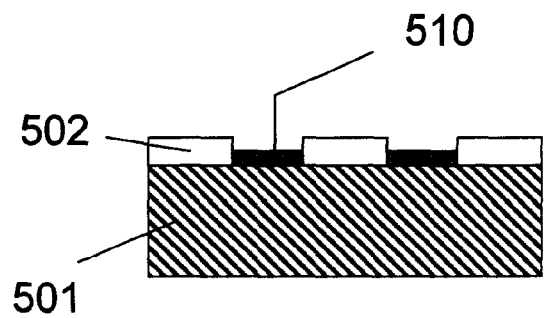
Figure 5C:
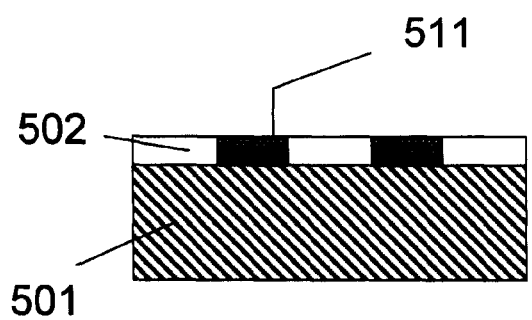
Figure 5D:
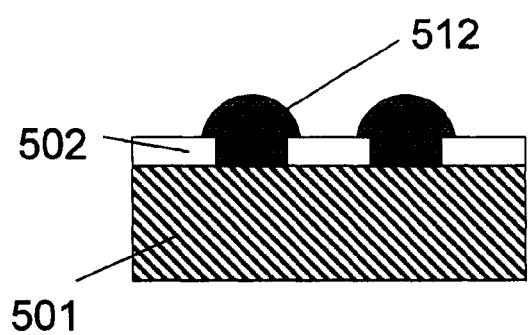

FIGS. 5B to 5D show substrate structure 500 after different amount of germanium compound have been electrodeposited onto exposed region of base semiconductor surface 504. In FIG. 5B, the top surface of the electrodeposited germanium compound 510 remains below the top surface of the patterned stencil 502. In FIG. 5C, the top surface of the electrodeposited germanium compound 511 is even with the top surface of the patterned stencil 502. In FIG. 5D, the top surface of the electrodeposited germanium compound 512 extends above the top surface of the patterned stencil 502 and exhibits a characteristic mushroom shape. For phase change device applications it is expected that the overfilled geometry of FIG. 5D would be less preferred than the underfilled geometry of FIG. 5B or the even fill geometry of FIG. 5C.

Figure 5E:
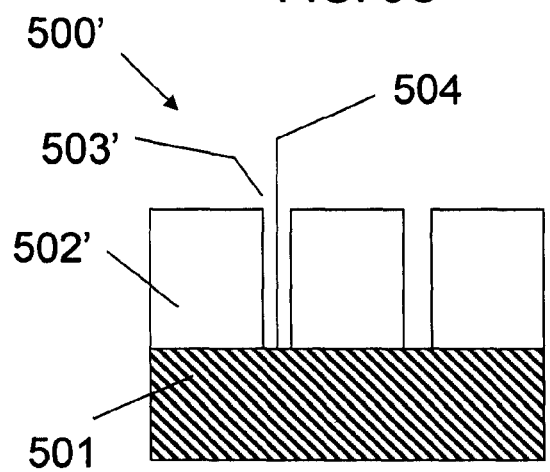
Figure 5F:
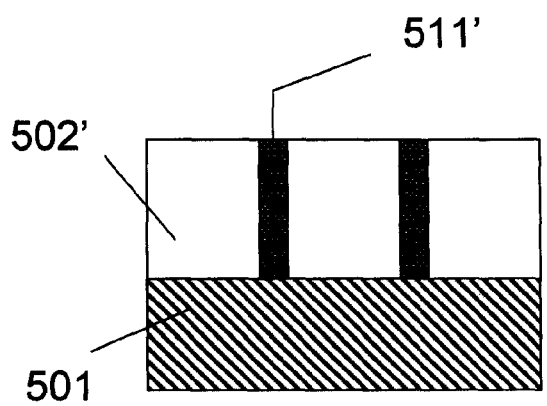

Substrate structure 500' of FIG. 5E differs from substrate structure 500 of FIG. 5A only in the aspect ratios of openings 503' in patterned stencil 502'. Openings 503 in structure 500 of FIG. 5A are shallow and wide to provide a film-shaped deposit whereas openings 503' in structure 500, of FIG. 5E are deep and narrow to provide wire-like or wall-like deposit. FIG. 5F shows the substrate structure 500' after the germanium compound material is electrodeposited on the exposed region of base semiconductor surface 504 with the deposited germanium compound 511' even with the top surface of the stencil 502'. Similarly, as shown in FIGS. 5B and 5D, the electrodeposited germanium compound can be below or extend above the top surface of the stencil 502'.

Figure 5G:
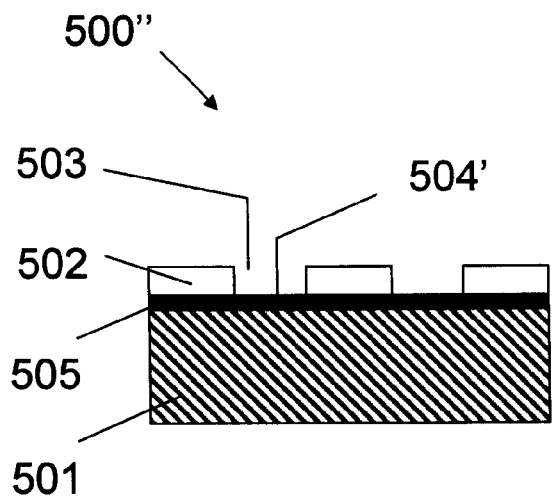
Figure 5H:
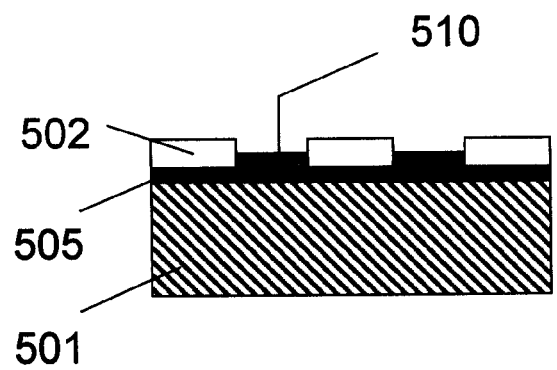

Substrate structure 500", of FIG. 5G, differs from substrate structure 500 of FIG. 5A only in the presence of interface layer 505. FIG. 5H shows the substrate structure 500" after the germanium compound material is electrodeposited on the exposed interlayer surface 504' with the deposited germanium compound 510 below the top surface of the stencil 502. As shown in FIGS. 5C and 5D, the electrodeposited germanium compound may be even with or extend above the top surface of the stencil 502.

The purpose of the interface layer 505 includes, but is not limited to, improving the adhesion between the stencil 502 and the base semiconductor 501, improving the adhesion between the germanium compound material and the base semiconductor 501, and preventing the diffusion of the germanium compound materials into the base semiconductor 501. Suitable materials for interface layer 505 include, but are not limited to, Ti, TiN, Ta, TaN, Ta, Ru, and any metals as well as any combinations of the above. In one version of substrate 500", the interface 505 is metal or any conductive material, the base substrate 501 may be non-conductive materials, and the plating current/potential is applied directly to the conductive interface layer 505.

Figure 5I:
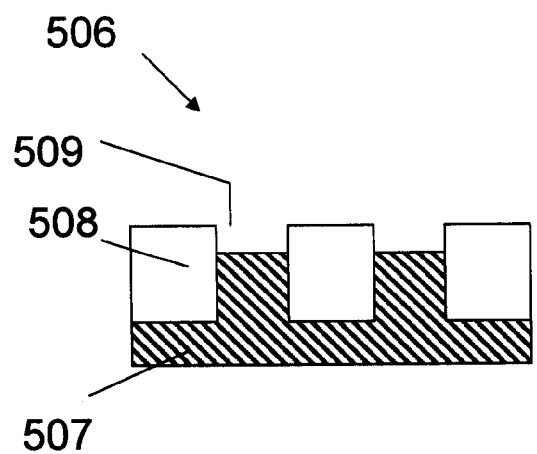
Figure 5J:
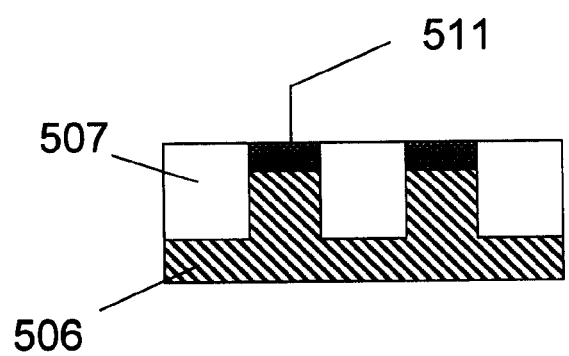

Substrate structure 506 of FIG. 5I comprises base semiconductor 507 having exposed semiconductor surface regions 509 and embedded patterned insulating regions 508, which may extend above the top surface of base semiconductor 507 (as shown) or be even with or below the top surface of base semiconductor 507 (not shown). FIG. 5J shows substrate structure 506 after germanium compound being electrodeposited on exposed semiconductor substrate regions 509 to leave the top surface of electrodeposited germanium compound 510 even with the top surface of embedded insulating regions 508. As shown in FIGS. 5B and 5D, the amount of plating may be adjusted to leave the surface of the electrodeposited germanium compound above or below the top surface of embedded insulating regions 508.

Obviously, numerous modifications and variations of the disclosure are possible in light of the above disclosure. It is therefore understood that within the scope of the appended claims, the disclosure may be practiced otherwise than as specifically described herein.

All publications, patents and patent applications cited in this specification are herein incorporated by reference, and for any and all purposed, as if each individual publication, patent or patent application were specifically and individually indicates to be incorporated by reference. In the case of inconsistencies, the present disclosure will prevail.

What is claimed is:

1. A method of electrodepositing a germanium compound on an exposed region of a substrate structure, the method comprising:
   forming a plating solution by dissolving at least one germanium salt, at least one antimony salt, and at least one telluride salt in water;
   obtaining a substrate with a clean surface;
   immersing the substrate in the solution; and
   electroplating the germanium compound on the substrate by applying an electrical potential between the substrate and an anode in the plating solution, wherein the germanium compound is $Ge_xSb_yTe_z$, wherein $0<x<0.4$, $0<y<0.8$, and $0<z<0.8$.

2. The method according to claim 1, wherein the germanium salt is $GeO_2$.

3. The method according to claim 1, wherein the plating solution comprises one or more chemicals selected from the group consisting of $Sb_2O_3$, $SbCl_3$, $TeO_2$, and $TeCl_4$.

4. The method according to claim 1, wherein the plating solution comprises 1 to 100 mM $GeO_2$, up to 10 mM $Sb_2O_3$, and up to 10 mM $TeO_2$, wherein the pH of the solution is up to 2.

5. The method according to claim 4, wherein the plating solution comprises 10 mM $GeO_2$, 1 mM $Sb_2O_3$, 0.5 mM $TeO_2$, 1 M $H_2SO_4$, and 1 M $HNO_3$, wherein the pH of the solution is 1.5.

6. The method according to claim 1, wherein the substrate comprises a base semiconductor and a patterned stencil on or embedded in the semiconductor, wherein the stencil comprises insulating regions and openings and the semiconductor surface is exposed in the openings of the stencil.

7. The method according to claim 6, wherein the semiconductor is selected from the group consisting of Si, Ge, SiGe, SiC, SiGeC, III-V materials and II-IV materials, and layered combinations thereof.

8. The method according to claim 7, wherein an interlayer is on the semiconductor surface.

9. The method according to claim 1, wherein the substrate is cleaned by immersing the substrate in hydrofluoric acid solution.

10. The method according to claim 1, wherein the substrate is n-type Si and a layer of TiN is formed on the Si.

11. The method according to claim 1, wherein the electrodeposition is carried out at temperatures below 80° C.

12. The method according to claim 11, wherein the temperature is room temperature.

13. The method according to claim 1, wherein the electrodeposition is carried out by applying DC current, pulse current, or a combination thereof.

14. The method according to claim 1, wherein the electrodeposition is carried out by a DC current density ranging from about 0.1 mA/cm$^2$ to about −20 mA/cm$^2$.

15. The method according to claim 14, wherein the current density is −3 mA/cm$^2$.

16. The method according to claim 13, wherein the pulse current comprises a −1 mA/cm$^2$ pulse for 5 seconds and a −3 mA/cm$^2$ pulse for 5 seconds.

17. The method according to claim 13, wherein the pulse current comprises a −0.8 V (versus MSE) pulse for 1 second and a −1.5 V (versus MSE) pulse for 1 second.

18. The method according to claim 1, wherein the substrate rotates up to about 4000 rpm.

* * * * *